United States Patent
Xiao et al.

(10) Patent No.: US 12,244,160 B2
(45) Date of Patent: Mar. 4, 2025

(54) SYSTEM AND METHOD FOR DELIVERING POWER TO A PORTABLE DEVICE

(71) Applicant: Harman International Industries, Incorporated, Stamford, CT (US)

(72) Inventors: Yong Xiao, KaiZhou (CN); Bo Zhong, Chengdu (CN)

(73) Assignee: Harman International Industries, Incorporated, Stamford, CT (US)

( * ) Notice: Subject to any disclaimer, the term of this patent is extended or adjusted under 35 U.S.C. 154(b) by 647 days.

(21) Appl. No.: 17/372,484

(22) Filed: Jul. 11, 2021

(65) Prior Publication Data
US 2023/0009995 A1    Jan. 12, 2023

(51) Int. Cl.
*H02J 7/00* (2006.01)
*B60L 53/65* (2019.01)
*B60L 53/66* (2019.01)
*H01M 10/42* (2006.01)
*H03F 3/183* (2006.01)
*H04R 1/02* (2006.01)

(52) U.S. Cl.
CPC ...... *H02J 7/00034* (2020.01); *H02J 7/00032* (2020.01); *H02J 7/00036* (2020.01); *H02J 7/00045* (2020.01); *H02J 7/00047* (2020.01); *B60L 53/65* (2019.02); *B60L 53/66* (2019.02); *H01M 10/4257* (2013.01); *H01M 2010/4278* (2013.01); *H02J 7/0063* (2013.01); *H02J 7/0071* (2020.01); *H03F 3/183* (2013.01); *H03F 2200/03* (2013.01); *H04R 1/02* (2013.01); *H04R 2201/028* (2013.01)

(58) Field of Classification Search
CPC ............... H02J 7/00032; H02J 7/00034; H02J 7/00036; H02J 7/00038; H02J 7/00041; H02J 7/00043; H02J 7/00045; H02J 7/00047; H02J 7/00063; H02J 7/0047; H02J 7/00712; H02J 7/0063; H02J 7/007; H02J 2310/22; H03F 3/183; H03F 2200/03; H04R 1/02; H04R 2201/028; H04R 2400/00; H02M 7/48; H01M 2010/4278; B60L 53/65; B60L 53/66
USPC ....................................................... 320/137
See application file for complete search history.

(56) References Cited

U.S. PATENT DOCUMENTS

| 5,592,069 A | * | 1/1997 | Dias | .......................... G01K 7/13 320/152 |
| 5,694,024 A | * | 12/1997 | Dias | ..................... H02J 7/00047 429/90 |
| 5,867,006 A | * | 2/1999 | Dias | .......................... G01K 7/13 320/110 |
| 6,018,228 A | * | 1/2000 | Dias | .......................... G01K 7/13 320/110 |

(Continued)

*Primary Examiner* — John T Trischler
(74) *Attorney, Agent, or Firm* — Angela M. Brunetti (57) ABSTRACT

A method and system for controlling power delivery to an electronic device having default and proprietary power modes. A default power delivery protocol between the power delivery adapter and the electronic device is completed upon connecting the power delivery adapter to the electronic device. When a proprietary power mode is available, it is verified and communicated to the power delivery adapter, wherein the power delivery adapter delivers power to the electronic device according to the proprietary power mode. When a proprietary power mode is not available, the power delivery adapter continues to deliver power in the default mode.

12 Claims, 4 Drawing Sheets

(56) References Cited

U.S. PATENT DOCUMENTS

| | | | |
|---|---|---|---|
| 6,728,551 B2* | 4/2004 | Chang | H04W 52/54 455/69 |
| 6,901,268 B2* | 5/2005 | Chang | H04W 52/60 455/69 |
| 6,969,970 B2* | 11/2005 | Dias | H01M 10/48 320/106 |
| 8,261,100 B2* | 9/2012 | Paniagua, Jr. | G06F 1/263 713/300 |
| 8,446,126 B2* | 5/2013 | Cheng | H02J 7/00 381/26 |
| 9,609,435 B2* | 3/2017 | Osborn | H04R 5/02 |
| 9,908,428 B2* | 3/2018 | Kim | H02J 7/00036 |
| 10,000,136 B2* | 6/2018 | Jang | B60L 53/64 |
| 10,014,703 B2* | 7/2018 | Wang | H02J 7/00 |
| 10,090,700 B2* | 10/2018 | Zhang | H02J 7/02 |
| 10,122,201 B2* | 11/2018 | Zhang | H02J 7/00712 |
| 10,131,241 B2* | 11/2018 | Lee | B60L 53/66 |
| 10,141,766 B2* | 11/2018 | Zhang | H02J 7/0047 |
| 10,164,455 B2* | 12/2018 | Chan | H02J 7/0047 |
| 10,181,745 B2* | 1/2019 | Zhang | H02M 3/33523 |
| 10,218,209 B2* | 2/2019 | Kamath | H02J 7/007 |
| 10,224,737 B2* | 3/2019 | Zhang | H02J 7/0013 |
| 10,237,655 B2* | 3/2019 | Osborn | H04R 1/2834 |
| 10,263,449 B2* | 4/2019 | MacDonald | H02J 7/007 |
| 10,277,053 B2* | 4/2019 | Zhang | H02J 7/06 |
| 10,291,043 B2* | 5/2019 | Zhang | H02J 7/0042 |
| 10,312,712 B2* | 6/2019 | Zhang | H02J 7/00711 |
| 10,320,217 B2* | 6/2019 | Zhang | G01R 31/2874 |
| 10,320,225 B2* | 6/2019 | Tian | H02M 3/33523 |
| 10,326,297 B2* | 6/2019 | Zhang | H02J 7/007182 |
| 10,333,331 B2* | 6/2019 | Zhang | H02J 7/0044 |
| 10,340,717 B2* | 7/2019 | Zhang | H02J 7/00712 |
| 10,340,718 B2* | 7/2019 | Zhang | H02J 7/0044 |
| 10,340,727 B2* | 7/2019 | Zhang | H02J 7/007182 |
| 10,348,121 B2* | 7/2019 | Zhang | H02J 7/0013 |
| 10,381,861 B2* | 8/2019 | Zhang | H02J 7/0071 |
| 10,389,164 B2* | 8/2019 | Tian | H02M 1/08 |
| 10,411,496 B2* | 9/2019 | Zhang | H02J 7/007182 |
| 10,418,835 B2* | 9/2019 | Zhang | H02J 7/00036 |
| 10,424,953 B2* | 9/2019 | Zeng | H02J 7/02 |
| 10,424,954 B2* | 9/2019 | Zhang | H04B 3/54 |
| 10,424,959 B2* | 9/2019 | Kim | H02J 7/0071 |
| 10,431,992 B2* | 10/2019 | Kawamura | H02J 7/0013 |
| 10,461,568 B2* | 10/2019 | Zhang | H01M 10/425 |
| 10,491,030 B2* | 11/2019 | Tian | H02J 7/007182 |
| 10,516,290 B2* | 12/2019 | Zhang | H04M 19/00 |
| 10,608,462 B2* | 3/2020 | Tian | H02J 7/007192 |
| 10,622,829 B2* | 4/2020 | Zhang | H02J 7/02 |
| 10,644,530 B2* | 5/2020 | Tian | H02M 5/04 |
| 10,651,677 B2* | 5/2020 | Chen | H02M 7/217 |
| 10,664,102 B2* | 5/2020 | Zhang | G06F 3/0488 |
| 10,666,067 B2* | 5/2020 | Higgins | H04R 1/1025 |
| 10,673,261 B2* | 6/2020 | Zeng | H04M 19/08 |
| 10,680,460 B2* | 6/2020 | Zhang | H02J 7/0042 |
| 10,714,963 B2* | 7/2020 | Tian | H02J 7/06 |
| 10,727,687 B2* | 7/2020 | Zhang | H02J 7/007 |
| 10,747,369 B2* | 8/2020 | Zhang | G06F 3/0488 |
| 10,749,371 B2* | 8/2020 | Zhang | H02M 3/33507 |
| 10,773,605 B2* | 9/2020 | Lee | B60L 53/63 |
| 10,790,696 B2* | 9/2020 | Zhang | H02M 3/33515 |
| 10,886,772 B2* | 1/2021 | Zhang | H02J 7/007182 |
| 10,910,852 B2* | 2/2021 | Zhang | H02M 3/33507 |
| 10,910,861 B2* | 2/2021 | Tian | H02J 7/007182 |
| 10,910,866 B2* | 2/2021 | Zhang | H02J 7/00712 |
| 10,992,160 B2* | 4/2021 | Zhang | H02J 7/0047 |
| 11,070,076 B2* | 7/2021 | Zhang | H02M 3/33507 |
| 11,075,536 B2* | 7/2021 | Jung | H02J 7/0071 |
| 11,159,897 B2* | 10/2021 | Frei | H02J 7/0071 |
| 11,539,230 B2* | 12/2022 | Tian | H01M 10/0525 |
| 11,646,585 B2* | 5/2023 | Wang | H02J 7/00047 320/137 |
| 11,910,171 B2* | 2/2024 | Dang | H03G 3/3005 |
| 11,938,834 B2* | 3/2024 | Kawamoto | G06Q 50/06 |
| 12,032,422 B2* | 7/2024 | Enomoto | G06F 1/266 |
| 12,071,078 B2* | 8/2024 | Ma | G06F 13/385 |
| 12,090,872 B2* | 9/2024 | Woods | H02J 7/342 |
| 2001/0046878 A1* | 11/2001 | Chang | H04W 52/60 455/69 |
| 2002/0012326 A1* | 1/2002 | Chang | H04W 52/54 370/318 |
| 2002/0117993 A1* | 8/2002 | Dias | H01M 10/425 320/106 |
| 2003/0189417 A1* | 10/2003 | Dias | H02J 7/00036 320/134 |
| 2005/0151505 A1* | 7/2005 | Dias | H02J 7/00047 320/106 |
| 2006/0284595 A1* | 12/2006 | Hsieh | H02J 7/00712 320/115 |
| 2008/0222431 A1* | 9/2008 | Paniagua | H02J 7/00047 713/300 |
| 2012/0032531 A1* | 2/2012 | Cheng | H02J 7/00 307/150 |
| 2013/0076299 A1* | 3/2013 | Chao | H02J 7/00036 320/106 |
| 2014/0098979 A1* | 4/2014 | Osborn | H04R 5/02 381/300 |
| 2014/0300321 A1* | 10/2014 | Kim | H02J 7/0048 320/137 |
| 2016/0043586 A1* | 2/2016 | Wang | H02J 7/00047 320/137 |
| 2016/0099581 A1* | 4/2016 | Kawamura | H02J 7/0048 320/107 |
| 2016/0167538 A1* | 6/2016 | Kim | B60L 53/53 320/109 |
| 2016/0344230 A1* | 11/2016 | Chan | H02J 7/0047 |
| 2017/0093189 A1* | 3/2017 | Zeng | H02J 7/02 |
| 2017/0113563 A1* | 4/2017 | Lee | B60L 53/11 |
| 2017/0129348 A1* | 5/2017 | Jang | B60L 53/11 |
| 2017/0201831 A1* | 7/2017 | Osborn | H04R 1/2834 |
| 2017/0229877 A1* | 8/2017 | Zhang | H02M 1/08 |
| 2017/0256973 A1* | 9/2017 | Kim | H02J 7/0071 |
| 2017/0279286 A1* | 9/2017 | Zhang | H02J 7/0042 |
| 2017/0338670 A1* | 11/2017 | Zhang | H01F 27/425 |
| 2018/0019611 A1* | 1/2018 | Zhang | H02J 7/06 |
| 2018/0026469 A1* | 1/2018 | Kamath | H02J 7/04 320/106 |
| 2018/0026472 A1* | 1/2018 | Zhang | H02M 3/33576 320/145 |
| 2018/0034293 A1* | 2/2018 | Zhang | H02J 7/04 |
| 2018/0034296 A1* | 2/2018 | Zhang | H02J 7/00 |
| 2018/0034301 A1* | 2/2018 | Zhang | H02M 1/08 |
| 2018/0034309 A1* | 2/2018 | Zhang | H02J 7/0044 |
| 2018/0034310 A1* | 2/2018 | Zhang | H02M 3/156 |
| 2018/0034311 A1* | 2/2018 | Zhang | H02J 7/1492 |
| 2018/0034379 A1* | 2/2018 | Zhang | H02M 1/08 |
| 2018/0048164 A1* | 2/2018 | Zhang | H02M 1/08 |
| 2018/0048172 A1* | 2/2018 | Zhang | H02M 3/33523 |
| 2018/0048175 A1* | 2/2018 | Zhang | H01F 27/425 |
| 2018/0048179 A1* | 2/2018 | Zhang | H02J 7/007192 |
| 2018/0062409 A1* | 3/2018 | Jung | H02J 7/0071 |
| 2018/0062413 A1* | 3/2018 | Zhang | H02J 7/02 |
| 2018/0062423 A1* | 3/2018 | Zhang | H02J 7/1492 |
| 2018/0069414 A1* | 3/2018 | Zhang | H02M 1/08 |
| 2018/0069418 A1* | 3/2018 | Tian | H02M 1/44 |
| 2018/0076636 A1* | 3/2018 | Zhang | H02M 3/33546 |
| 2018/0090977 A1* | 3/2018 | Zhang | H02J 7/00711 |
| 2018/0123376 A1* | 5/2018 | Zhang | H02J 7/007182 |
| 2018/0123383 A1* | 5/2018 | Tian | H02M 3/33523 |
| 2018/0183262 A1* | 6/2018 | Tian | H02J 7/00711 |
| 2018/0233939 A1* | 8/2018 | Zhang | G01R 31/2874 |
| 2018/0241231 A1* | 8/2018 | Zhang | H02J 7/02 |
| 2018/0254650 A1* | 9/2018 | Wang | H02J 7/00047 |
| 2018/0254711 A1* | 9/2018 | Zhang | H02M 1/08 |
| 2018/0294666 A1* | 10/2018 | Tian | H02M 3/33523 |
| 2018/0331561 A1* | 11/2018 | Zhang | H01F 27/425 |
| 2018/0331562 A1* | 11/2018 | Zhang | H02J 7/02 |
| 2018/0331612 A1* | 11/2018 | Zhang | H02J 7/00043 |
| 2018/0332408 A1* | 11/2018 | Frei | H02J 7/0071 |
| 2018/0351396 A1* | 12/2018 | Chen | H02J 7/00711 |
| 2018/0367047 A1* | 12/2018 | Zhang | H02M 3/33523 |
| 2019/0006855 A1* | 1/2019 | MacDonald | H02J 7/0048 |
| 2019/0034054 A1* | 1/2019 | Zhang | G06F 3/0418 |

(56) References Cited

U.S. PATENT DOCUMENTS

| | | | | |
|---|---|---|---|---|
| 2019/0058347 | A1* | 2/2019 | Zhang | H02J 7/007182 |
| 2019/0061548 | A1* | 2/2019 | Lee | B60L 53/11 |
| 2019/0157895 | A1* | 5/2019 | Zhang | H02J 7/00 |
| 2019/0252904 | A1* | 8/2019 | Tian | H02J 7/02 |
| 2019/0260218 | A1* | 8/2019 | Tian | H02M 1/08 |
| 2019/0312446 | A1* | 10/2019 | Zeng | H02J 7/04 |
| 2019/0334369 | A1* | 10/2019 | Tian | H02J 7/06 |
| 2019/0386498 | A1* | 12/2019 | Higgins | H04R 25/30 |
| 2019/0391721 | A1* | 12/2019 | Zhang | G06F 3/0488 |
| 2019/0393716 | A1* | 12/2019 | Tian | H02J 7/0071 |
| 2020/0083739 | A1* | 3/2020 | Zhang | H02J 7/02 |
| 2021/0221243 | A1* | 7/2021 | Kawamoto | H01M 10/48 |
| 2022/0078548 | A1* | 3/2022 | Dang | H03G 3/348 |
| 2022/0231524 | A1* | 7/2022 | Li | H02J 7/00714 |
| 2022/0242261 | A1* | 8/2022 | Tong | B60L 53/31 |
| 2023/0051385 | A1* | 2/2023 | Ma | B60R 11/0241 |
| 2023/0078697 | A1* | 3/2023 | Liu | G01R 31/371 340/636.12 |
| 2023/0099247 | A1* | 3/2023 | Enomoto | G06F 1/266 713/310 |
| 2023/0402853 | A1* | 12/2023 | Lee | H02J 50/80 |
| 2024/0017628 | A1* | 1/2024 | Woods | H02J 7/0042 |
| 2024/0107229 | A1* | 3/2024 | Dang | H03F 1/025 |
| 2024/0155565 | A1* | 5/2024 | He | H02J 50/80 |
| 2024/0198826 | A1* | 6/2024 | Kawamoto | B60L 53/65 |
| 2024/0372382 | A1* | 11/2024 | Feng | H02J 7/0031 |

\* cited by examiner

SYSTEM AND METHOD FOR DELIVERING POWER TO A PORTABLE DEVICE

TECHNICAL FIELD

The present disclosure relates to delivering power to a portable device and more particularly to negotiating power delivery to the portable device.

BACKGROUND

A portable device that has a rechargeable battery may use a power delivery (PD) adapter, such as a USB-C connector, to deliver power to the device for recharging the battery and for powering the device so that it may still operate while the battery is charging. Some examples of portable devices include, but are not limited to, a mobile device, a computer, a Bluetooth speaker, etc. Output power from the PD adapter may include 5V/3A (15 W), 9V/3A (27 W), 12v/3A (36W), 20V/3A(60W). Portable devices may have two output power modes wherein each power mode has a different configuration for power delivery. In a default output power mode, called battery mode, a component in the portable device, for example an audio amplifier in a portable loudspeaker, is only powered by the battery 2*15 W, so it does not matter if the device is plugged into the USB-C connector to recharge the battery. In a proprietary output power mode, the audio amplifier draws power 2*25 W from the PD adaptor to boost the performance of the audio amplifier.

The USB Type-C, or USB-C, connector is a universal connector that may be used as a PD adapter for charging the battery in the portable device. However, as discussed above, the power delivery mode may be specific for each manufacturer of a portable device and not all portable devices may recognize default and proprietary output power modes. Furthermore, when a component on the portable device is also boosted by power delivery from the PD adapter. Therefore, not all PD adapters may be capable of delivering the type of power needed for a particular manufacturer's device. In this situation, use of a generic PD adapter, or a PD adapter from a manufacturer other than the portable device manufacturer, may adversely affect the performance of the portable device. Referring to the portable loudspeaker example, when the PD adaptor provided by the portable speaker manufacturer is plugged in, the portable speaker operates in battery and power mode in that it draws power from both the battery and the PD adaptor to boost power to the audio amplifiers. To accomplish this, the PD adaptor communicates power delivery settings using a PD protocol that is specific to the manufacturer of both the PD adapter and the portable speaker. However, because a USB-C PD adaptor is a universal connector, it is possible that another manufacturer's PD adaptor may be used for the particular manufacturer's device, or that the particular manufacturer's adapter may be used on another device.

SUMMARY

A method and system for controlling power delivery to an electronic device having default and proprietary power modes. A default power delivery protocol between the power delivery adapter and the electronic device is completed upon connecting the power delivery adapter to the electronic device.

When a proprietary protocol is available, it is verified and communicated to the power delivery adapter, wherein the power delivery adapter delivers power to the electronic device according to the proprietary power mode. When a proprietary protocol is not available, the power delivery adapter continues to deliver power in the default mode.

Elements and steps in the figures are illustrated for simplicity and clarity and have not necessarily been rendered according to any sequence. For example, steps that may be performed concurrently or in different order are illustrated in the figures to help to improve understanding of embodiments of the present disclosure.

DETAILED DESCRIPTION

While various aspects of the present disclosure are described with reference to FIGS. 1-4A and 4B, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Figure 1:
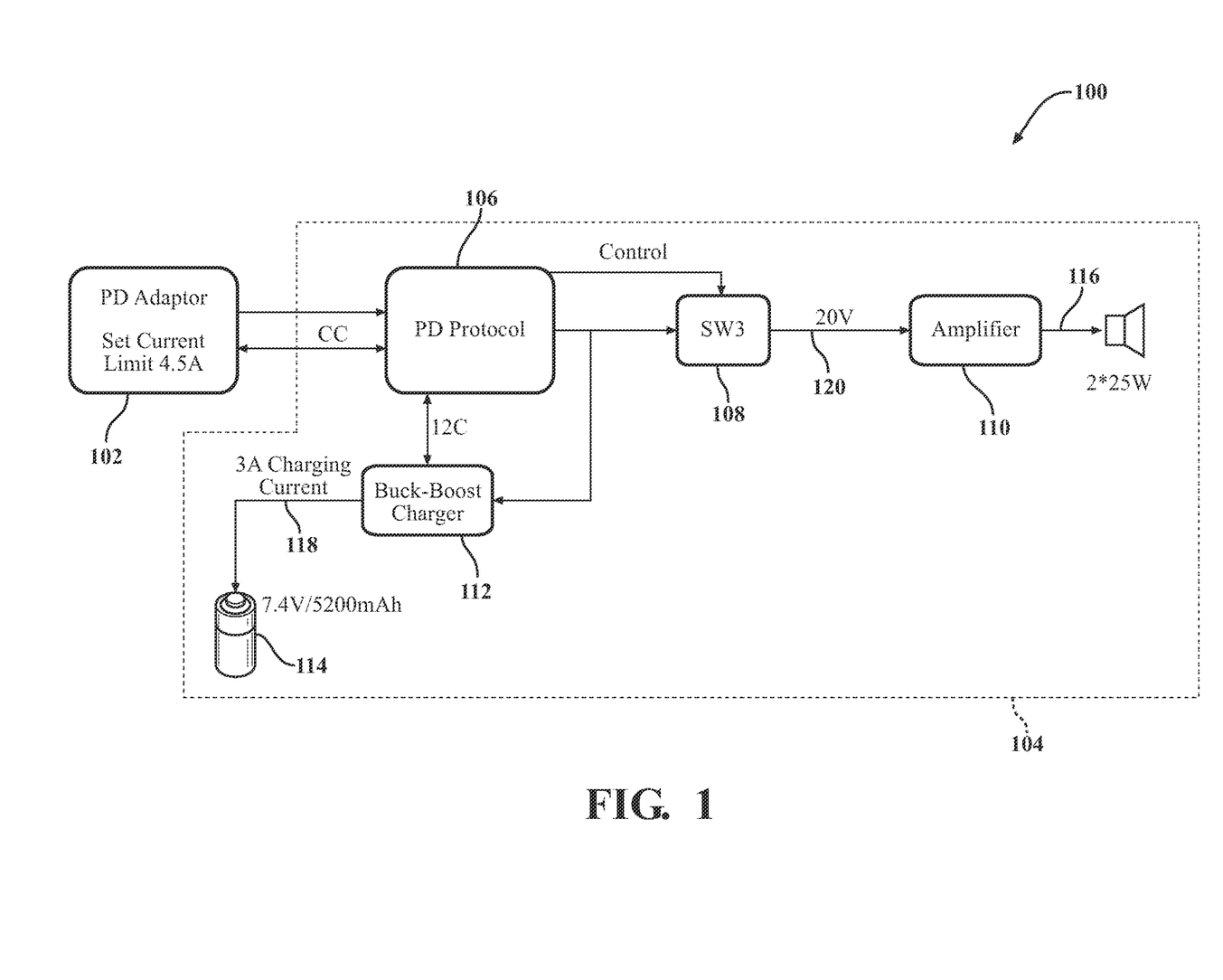
FIG. 1. is a block diagram of power delivery management of a proprietary output power mode for an PD adapter and a portable device from a manufacturer.

FIG. 1. is a block diagram of power delivery management for a proprietary power mode 100 for delivering output power in a proprietary power output mode, also called an AC power mode. The proprietary power mode 100 is for a power delivery (PD) adapter 102 and a portable device 104, both originating from a first manufacturer. In the example shown in FIG. 1, the portable device 104 is a portable loudspeaker, having a PD protocol 106 that, for the PD adapter 102 of the same manufacturer, controls a first switch 108, an amplifier 110, a buck-boost charger 112, and a battery 114. The PD adapter 102 powers the portable device 104 using one of two output power delivery modes. In a proprietary output power mode, the amplifier 110 may draw power from the PD adapter 102, for example, 2*25 W 116. The PD adapter 102 also provides 3A fast charging 118 to the battery 114. In the proprietary power delivery mode, output power 116 is modified by the proprietary protocol to output 2*25 W.

The PD adaptor 102 and the portable device 104, both being from the first manufacturer, communicate using PD protocol 106 to control the first switch 108 to supply a voltage 120 of 20V to the amplifier 110. The PD protocol 106 also controls the buck-boost charger 112 to deliver a charging current 118 of 3A for fast charging the battery 114. In the proprietary power delivery mode, the PD adapter 102 supplies power to charge the battery 114 and the amplifier 110 on the portable device 104 also draws power from the PD adapter 102.

Figure 2:
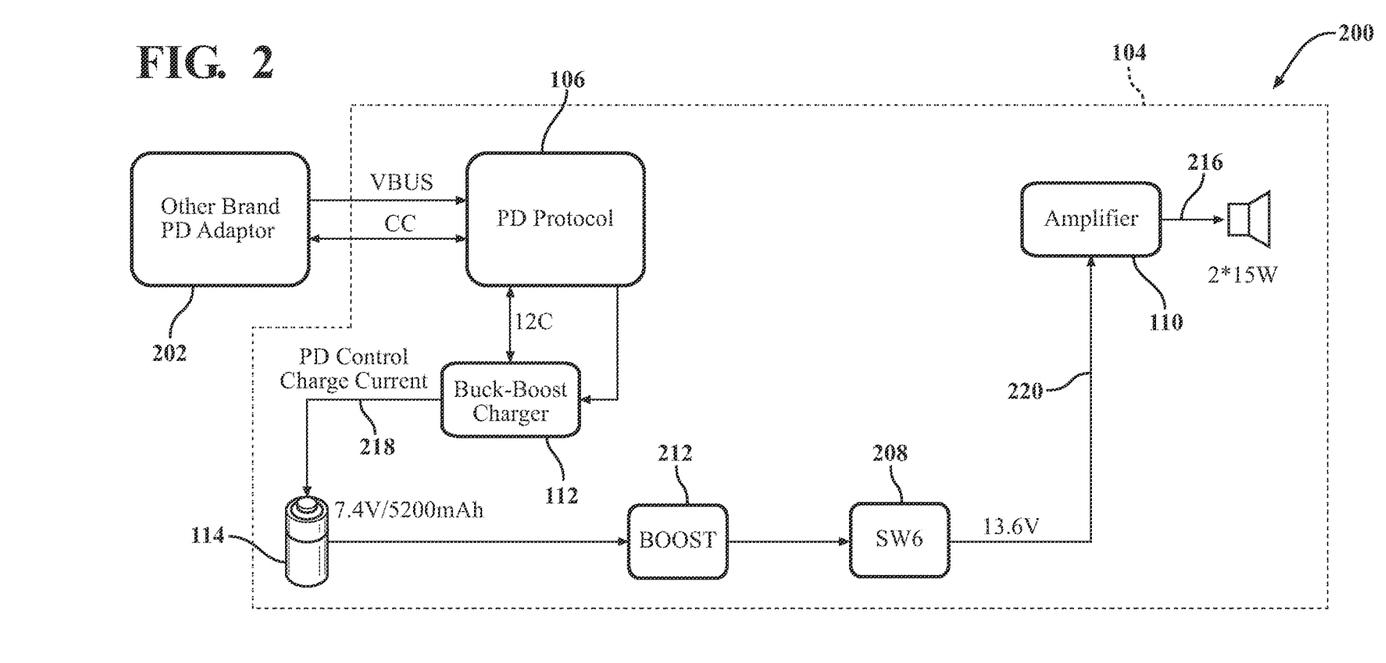
FIG. 2 is a block diagram of power delivery management of a default output power mode to a portable device for the first manufacturer and a PD adapter from a second manufacturer.

FIG. 2 is a block diagram of a power delivery management for a default power mode 200 to the portable device 104 of the first manufacturer when it is connected to a PD adapter 202 from a second manufacturer. When a PD adaptor 202, for example from a second manufacturer, is plugged in to the portable device 104, the PD protocol 106 causes the portable device 104 to operate in a default power mode 200. The PD protocol 106 interacts with the battery 114, a second switch 208 and a booster 212 to provide output power for the default power mode 200. In the default power mode, also called a battery mode, the amplifier 110 only draws power 216 from the battery 114, for example, 2*15 W. The PD adapter 202 delivers a PD charge control current 218 to the battery 114 for charging. The amplifier 110 draws a voltage 220 of 13.6V only from the battery 114.

Figure 3:
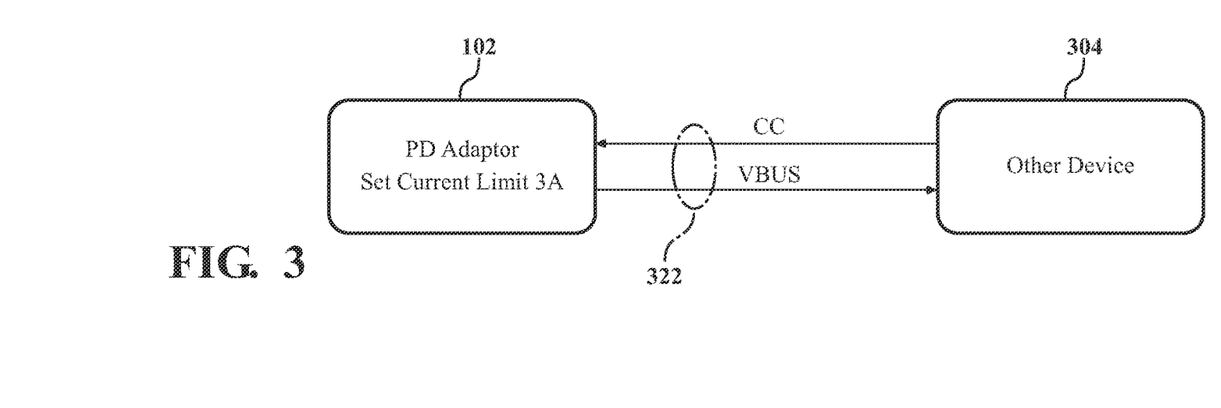
FIG. 3 is a block diagram of power delivery management of a default output power mode to a device of the second manufacturer and a PD adapter from the first manufacturer.

FIG. 3 is a block diagram of a power delivery management from the PD adapter 102 of the first manufacturer when connected to a device 304 of the second manufacturer. In this arrangement, the PD adapter 102 delivers power according to a default power delivery mode 322, for example to 20V and 3A.

Figure 4A:
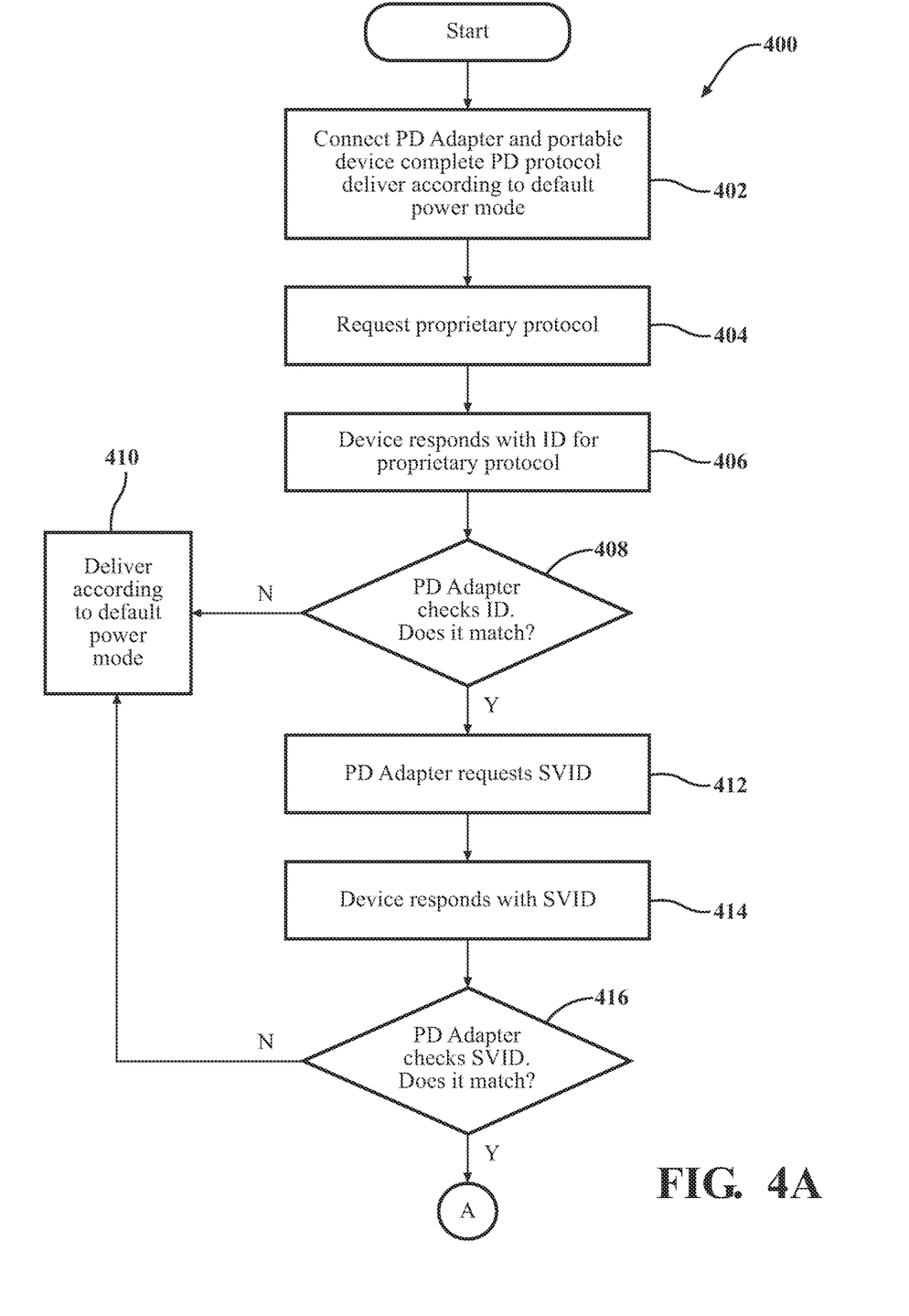
FIGS. 4A and 4B show a flow diagram of a method for power delivery according to one or more embodiments.
Figure 4B:
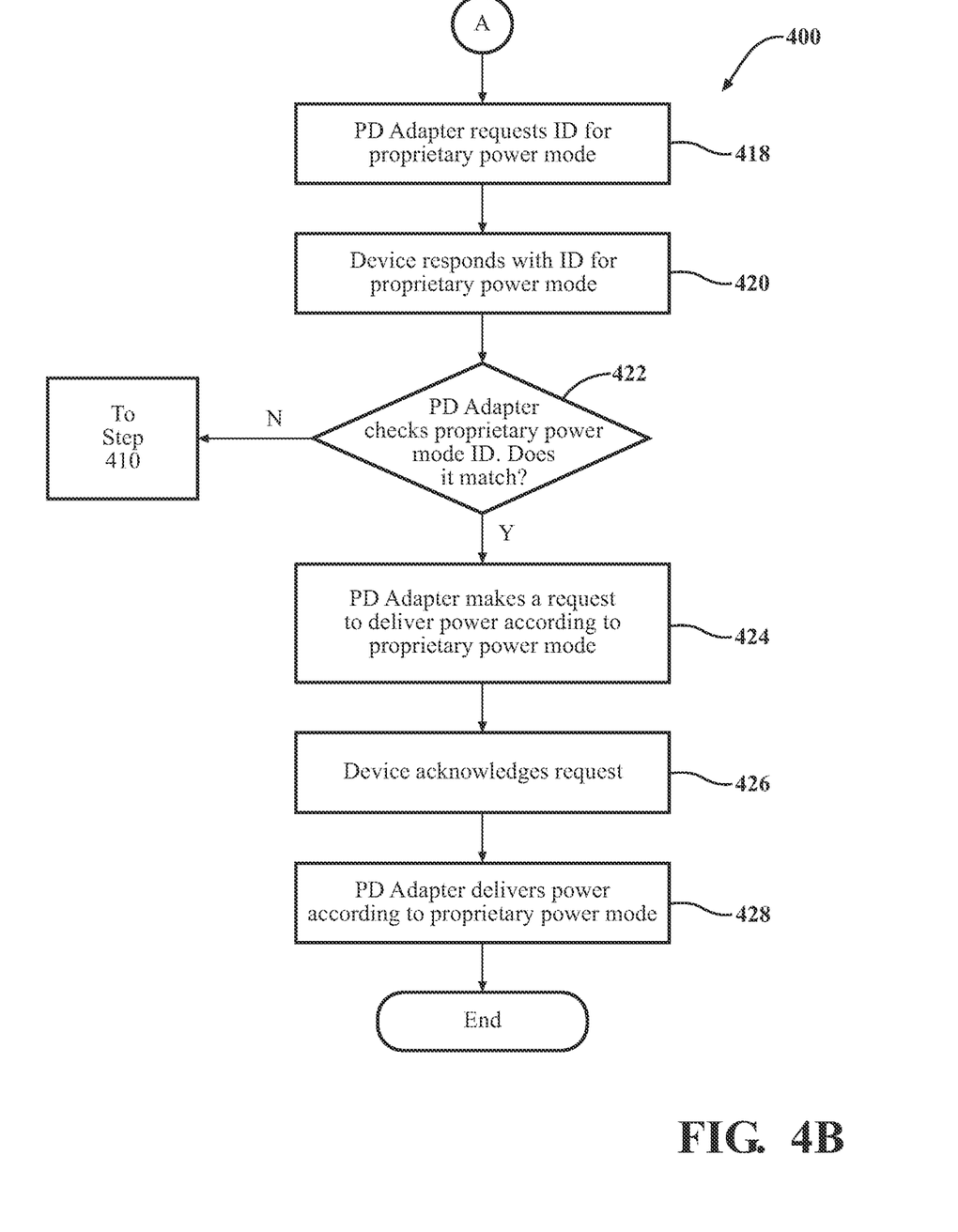

FIGS. 4A and 4B show a flow diagram of a method for power delivery negotiation 400 according to one or more embodiments for negotiating between a proprietary power mode, AC power mode and a default power mode, battery mode. The method is carried out in one or more processors on the PD adapter and/or the portable device. The one or more processors have a memory, a communication interface, and a bus. The bus includes a circuit that connects elements, such as switches, a battery, and one or more boosters. The bus transmits communication (data or control messages) between the elements. The one or more processors have a CPU to carry out operations or data processing related to the control and/or communications between the elements. Memory includes volatile and non-volatile memory to store instructions including software programs, executed by the one or more processors to control or manage the devices according to the method described herein.

In a first step 402 a PD adapter is connected to a portable device, and a default power delivery protocol is communicated between the PD adapter and the portable device. The PD adapter outputs the default power delivery mode, also called the battery mode. In the present example, battery mode is a maximum output of 20V/3A and an amplifier on the portable device only draws power from the battery.

In step 404, the PD adapter makes a request for a proprietary protocol from the portable device. In step 406, the portable device responds with a vendor identification code, VID, and a product identification code, PID. In step 408 the PD adapter checks the VID to confirm it has the capability to provide the power necessary from the proprietary protocol. In the event the PD adapter cannot verify the VID, in step 410 the PD adapter continues to output the default power delivery mode. In the present example, an amplifier on the portable device will continue to draw power only from the battery on the portable device.

In the event the PD adapter can verify the VID provided by the portable device, in step 412 the PD adapter requests a standard or vendor identification code, SVID, from the portable device. In step 414 the portable device transmits the SVID to the PD adapter. In step 416, the PD adapter checks the SVID to confirm it has the capability to provide the power necessary from the proprietary protocol. In the event the PD adapter cannot verify the SVID, in step 410, the PD adapter continues to output the default power delivery mode. In the present example, the amplifier continues to draw power only from the battery.

In the event the PD adapter can verify the SVID, in step 418 the PD adapter makes a request for an identification (ID) for the proprietary power mode. In this example, the proprietary power mode is 90 W and an amplifier on the portable device will be able to draw power from the AC power provided by the PD adapter to boost the output of the amplifier. In step 420, the portable device responds with the ID. In step 422, the PD adapter confirms that it can enter the proprietary power mode. In step 424, the PD adapter requests confirmation to deliver power according to the proprietary output power mode. In step 426, device acknowledges and accepts the request and in step 428 the PD adapter enters the proprietary output power mode to be received at the portable device.

In the foregoing specification, the present disclosure has been described with reference to specific exemplary embodiments. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the steps recited in any method or process claims may be executed in any order, may be executed repeatedly, and are not limited to the specific order presented in the claims. Additionally, the components and/or elements recited in any apparatus claims may be assembled or otherwise operationally configured in a variety of permutations and are accordingly not limited to the specific configuration recited in the claims. Any method or process described may be carried out by executing instructions with one or more devices, such as a processor or controller, memory (including non-transitory), sensors, network interfaces, antennas, switches, actuators to name just a few examples.

Benefits, other advantages, and solutions to problems have been described above regarding particular embodiments; however, any benefit, advantage, solution to problem or any element that may cause any particular benefit, advantage, or solution to occur or to become more pronounced are not to be construed as critical, required, or essential features or components of any or all the claims.

The terms "comprise", "comprises", "comprising", "having", "including", "includes" or any variation thereof, are intended to reference a non-exclusive inclusion, such that a process, method, article, composition, or apparatus that comprises a list of elements does not include only those elements recited but may also include other elements not expressly listed or inherent to such process, method, article, composition, or apparatus. Other combinations and/or modifications of the above-described structures, arrangements, applications, proportions, elements, materials, or components used in the practice of the present disclosure, in addition to those not specifically recited, may be varied, or otherwise particularly adapted to specific environments, manufacturing specifications, design parameters or other operating requirements without departing from the general principles of the same.

What is claimed is:

1. A method for controlling power delivery to an electronic device having proprietary and default power modes for power delivery, the method comprising the steps of:
   connecting a power delivery adapter to the electronic device, wherein the electronic device is a portable loudspeaker having an amplifier and a rechargeable battery;
   completing a power delivery protocol between the power delivery adapter and the electronic device;
   delivering power to the electronic device according to the default power mode, wherein when power is delivered to the portable loudspeaker according to the default power mode, the amplifier only draws power from the battery;

requesting a proprietary protocol for the proprietary power mode from the electronic device;

when no proprietary protocol is communicated to the power delivery adapter, the power delivery adapter continues to deliver power to the electronic device according to the default power mode;

when the proprietary protocol is communicated to the power delivery adapter, the power delivery adapter makes a request to deliver the power to the electronic according to the proprietary power mode;

confirming the request to deliver power according to the proprietary power mode; and delivering power to the electronic device according to the proprietary power mode, wherein when power is delivered to the portable loudspeaker according to the proprietary power mode, an amplifier in the portable loudspeaker draws power from the power delivery adapter.

2. The method of claim 1, wherein the step of confirming the request to deliver power according to the proprietary power mode further comprises the steps of:

sending a power delivery mode identification to the power delivery adapter;

matching the power deliver mode identification with a power delivery identification stored in memory at the power delivery adapter;

sending the request to deliver power according to the proprietary power mode;

acknowledging, at the electronic device, the proprietary power mode; and delivering power to the electronic device according to the proprietary power mode.

3. The method according to claim 1, wherein the step of requesting the proprietary protocol further comprises the steps of:

communicating an identification code for the proprietary protocol;

verifying the identification code for the proprietary protocol matches an identification code stored in memory at the power delivery adapter.

4. The method according to claim 3, wherein the step of verifying the identification code further comprises the steps of:

requesting a standard or vendor identification (SVID) from the electronic device;

sending the SVID to the power delivery adapter; and matching the SVID with an SVID stored at the power delivery adapter.

5. The method of claim 1 wherein the power delivery adapter is a USB-C type connector.

6. The method according to claim 1, further comprising;

the default power mode delivers a maximum voltage of 20V and a maximum current of 3A.

7. The method of claim 1, further comprising:

the proprietary power mode delivers a maximum voltage of 20V and a maximum current of 4.5A.

8. A non-transitory computer-readable medium comprising a program, which when executed by one or more processors performs an operation comprising:

completing a power delivery protocol between a power delivery adapter and an electronic device having proprietary and default power modes;

delivering power to the electronic device according to a default power;

requesting a proprietary protocol for a proprietary power mode from the electronic device;

when no proprietary protocol is communicated to the power delivery adapter, the power delivery adapter continues to deliver power to the electronic device according to the default power mode;

when a proprietary protocol is communicated to the power delivery adapter, confirming the proprietary power mode; and upon confirmation of the proprietary power mode, delivering power to the electronic device according to the proprietary power mode;

wherein, the electronic device has a rechargeable battery and an amplifier whereby, when power is delivered according to the default power mode, the amplifier only draws power from the battery;

wherein when power is delivered according to the proprietary power mode, the amplifier draws power from the power delivery adapter.

9. The non-transitory computer-readable medium of claim 8, wherein confirming the proprietary power mode further comprises:

requesting a standard or vendor identification (SVID) from the electronic device;

confirming the SVID matches an SVID stored at the power delivery adapter; and upon confirmation, delivering power to the electronic device according to the proprietary power mode.

10. The non-transitory computer-readable medium of claim 8, wherein:

the proprietary power mode delivers a maximum voltage of 20V and a maximum current of 4.5A; and the default power mode delivers a maximum voltage of 20V and a maximum current of 3A.

11. An electronic device comprising:

a battery;

an amplifier;

an interface that receives external power from a power delivery adapter;

a proprietary power delivery mode;

a default power delivery mode;

a processor configured to communicate the proprietary power delivery mode to the power delivery adapter;

when the power delivery adapter has a standard or vendor identification (SVID) that matches an SVID of the electronic device, the power delivery adapter delivers power according to the proprietary power delivery mode; and when the power delivery adapter has an SVID that does not match an SVID of the electronic device, the power delivery adapter delivers power according to the default power delivery mode, the electronic device is a portable loudspeaker having the amplifier and a rechargeable battery;

when power is delivered to the portable loudspeaker according to the default power delivery mode, the amplifier only draws power from the battery;

when power is delivered to the portable loudspeaker according to the proprietary power delivery mode, the amplifier draws power from the power delivery adapter.

12. The electronic device of claim 11, wherein;

the default power mode delivers a maximum voltage of 20V and a maximum current of 3A; and the proprietary power mode delivers a maximum voltage of 20V and a maximum current of 4.5A.

* * * * *

UNITED STATES PATENT AND TRADEMARK OFFICE
CERTIFICATE OF CORRECTION

PATENT NO. : 12,244,160 B2
APPLICATION NO. : 17/372484
DATED : March 4, 2025
INVENTOR(S) : Yong Xiao and Bo Zhong Page 1 of 1

It is certified that error appears in the above-identified patent and that said Letters Patent is hereby corrected as shown below:

In the Claims

Column 5, Claim 1, Line 12, replace with "makes a request to deliver the power to the electronic device".

Column 5, Claim 8, Line 67, replace with "default power mode;".

Signed and Sealed this
Fifteenth Day of April, 2025

Coke Morgan Stewart
*Acting Director of the United States Patent and Trademark Office*